(12) United States Patent
Sarafianos et al.

(10) Patent No.: US 10,453,808 B2
(45) Date of Patent: Oct. 22, 2019

(54) METHOD FOR DETECTING THINNING OF AN INTEGRATED CIRCUIT SUBSTRATE VIA ITS REAR FACE, AND CORRESPONDING INTEGRATED CIRCUIT

(71) Applicant: STMicroelectronics (Rousset) SAS, Rousset (FR)

(72) Inventors: Alexandre Sarafianos, Pourrieres (FR); Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/129,163

(22) Filed: Sep. 12, 2018

(65) Prior Publication Data

US 2019/0081011 A1 Mar. 14, 2019

(30) Foreign Application Priority Data

Sep. 13, 2017 (FR) ...................................... 17 58480

(51) Int. Cl.
*H01L 23/00* (2006.01)
*H01L 21/66* (2006.01)
*H01L 29/861* (2006.01)
*H01L 29/06* (2006.01)

(52) U.S. Cl.
CPC ............ *H01L 23/576* (2013.01); *H01L 22/00* (2013.01); *H01L 29/0649* (2013.01); *H01L 29/8613* (2013.01)

(58) Field of Classification Search
None
See application file for complete search history.

(56) References Cited

U.S. PATENT DOCUMENTS

2019/0043814 A1* 2/2019 Marzaki ........... G06K 19/07381

FOREIGN PATENT DOCUMENTS

| CN | 206259348 U | 6/2017 |
| EP | 3236496 A1 | 10/2017 |
| EP | 3301715 A1 | 4/2018 |

OTHER PUBLICATIONS

INPI Search Report and Written Opinion for FR 1758480 dated Jul. 20, 2018 (8 pages).

* cited by examiner

*Primary Examiner* — Cassandra F Cox
(74) *Attorney, Agent, or Firm* — Crowe & Dunlevy

(57) ABSTRACT

An electronic integrated circuit includes a semiconductor substrate having a rear face. A device for detecting a thinning of the semiconductor substrate via its rear face is formed by a p-n junction that is biased into conduction. Thinning of the substrate is detected by monitoring a current flowing through the p-n junction, and comparing that current to a threshold. In the event the compared current indicates no thinning of the semiconductor substrate, the circuitry for biasing and comparing is deactivated.

12 Claims, 3 Drawing Sheets

METHOD FOR DETECTING THINNING OF AN INTEGRATED CIRCUIT SUBSTRATE VIA ITS REAR FACE, AND CORRESPONDING INTEGRATED CIRCUIT

PRIORITY CLAIM

This application claims the priority benefit of French Application for Patent No. 1758480, filed on Sep. 13, 2017, the content of which is hereby incorporated by reference in its entirety to the maximum extent allowable by law.

TECHNICAL FIELD

Modes of implementation and embodiments relate to integrated circuits, and more particularly to the detection of potential thinning of the substrate of an integrated circuit from its rear face.

BACKGROUND

Integrated circuits, in particular those equipped with memories containing sensitive information, have to be protected to the greatest possible extent against attacks, in particular attacks intended to discover data stored in memory cells of the integrated circuit.

A potential attack may be carried out using a focused ion beam (well known under the acronym FIB by those skilled in the art), for example by way of a laser beam.

The effectiveness of such an attack increases when the substrate of the integrated circuit is thinned by the attacker, from its rear face, so as to get as close as possible to the components of the integrated circuit that are formed at the front face of the integrated circuit.

There are means for detecting thinning of the substrate that make it possible to protect integrated circuits against this type of attack.

SUMMARY

According to one mode of implementation and embodiment, what is therefore proposed is an integrated circuit including a device that is configured to implement a method for detecting potential thinning of the substrate of an integrated circuit from its rear face, which is easy to implement and particularly compact in terms of surface area bulk.

According to one aspect, what is proposed is a method for detecting potential thinning of a semiconductor substrate of an integrated circuit from its rear face, the substrate comprising a first semiconductor well isolated from the rest of the substrate by at least one p-n junction delineating the bottom of the first well.

The method according to this aspect comprises biasing the junction corresponding to an on state of the junction, comparing a current flowing through the junction with a threshold value and generating a control signal having a first value corresponding to a detection of a lack of thinning of the substrate if the value of said current is greater than the threshold value, and having a second value corresponding to a detection of thinning of the substrate if the value of the current is lower than the threshold value.

After detection of a lack of thinning of the substrate, the method may comprise deactivating the biasing and comparing the value of said current with said threshold value.

According to another aspect, what is proposed is an integrated circuit including a semiconductor substrate having a rear face and a device for detecting thinning of the substrate via its rear face including a first semiconductor well electrically isolated from the rest of the substrate by a p-n junction delineating the bottom of the first well and by an isolation region, the device furthermore including: a biasing circuit configured, in a first configuration, to apply a bias to the junction corresponding to an on state of this junction, and a comparison circuit coupled to said junction and configured to compare a current flowing through said junction with a threshold value and to generate a control signal having a first value corresponding to a detection of a lack of thinning of the substrate if the value of said current is greater than the threshold value, and having a second value corresponding to a detection of thinning of the substrate if the value of the current is lower than the threshold value.

The use of the p-n junction formed by the well and the rest of the substrate thus makes it possible to produce a detection device using simple means.

According to one embodiment, the comparison circuit is activated in the first configuration and the detection device has a second configuration in which the comparison circuit is deactivated, and the integrated circuit furthermore comprises a control circuit that is configured to initially put the detection device in its first configuration and to change the device from its first configuration to its second configuration after detection of a lack of thinning of the substrate.

The isolation region may include: an isolating trench delineating the edges of the first well and extending into the substrate from a front face of the substrate as far as a distance from the bottom of the first well, and an additional isolation trench extending through the isolating trench, from the front face of the substrate at least as far as the p-n junction so as to provide continuity of the electrical isolation between the isolating trench and the bottom of the first well.

The integrated circuit may furthermore include a second semiconductor well that is formed alongside the first semiconductor well, a first contact zone being formed in the first well at the front face, and a second contact zone being formed in the second well at the front face, the biasing circuit being configured to apply a bias to the junction by applying a potential difference between the first contact zone and the second contact zone.

Each well thus enables easy contacting in order to bias the p-n junction.

The first well and the second well may furthermore each have a surface area of around 0.25 square micrometers at the front face, and the second well is separated from the other wells of the integrated circuit by at least 0.8 micrometers.

The biasing of each of the wells thus does not disrupt the operation of the other components of the integrated circuit.

According to one embodiment, the substrate has a first conductivity type, the first well is of a second conductivity type, the second well is of the first conductivity type and is electrically coupled to the rest of the substrate, and the p-n junction includes the junction between the first well and the rest of the substrate.

According to one embodiment, the substrate has a first conductivity type, the first well is of the first conductivity type, the second well is of the second conductivity type, the circuit furthermore including a buried semiconductor layer of the second conductivity type formed underneath the first semiconductor well and underneath the second semiconductor well, the p-n junction including the junction between the first well and the buried semiconductor layer.

According to another aspect, what is proposed is a system comprising an integrated circuit such as described above, the system being able to be a chip card.

BRIEF DESCRIPTION OF THE DRAWINGS

Other advantages and features of the invention will become apparent upon examining the detailed description of wholly non-limiting modes of implementation and embodiments of the invention and the appended drawings, in which.

DETAILED DESCRIPTION

Figure 2:
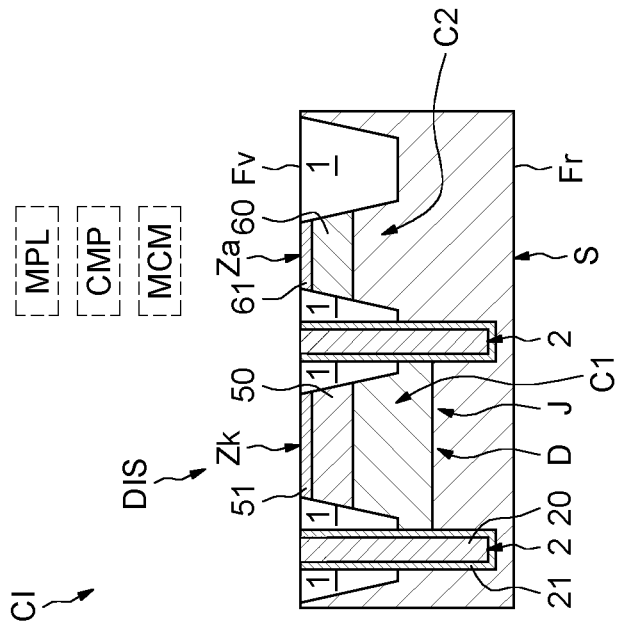
FIG. 2 is a cross-sectional view.
Figure 1:
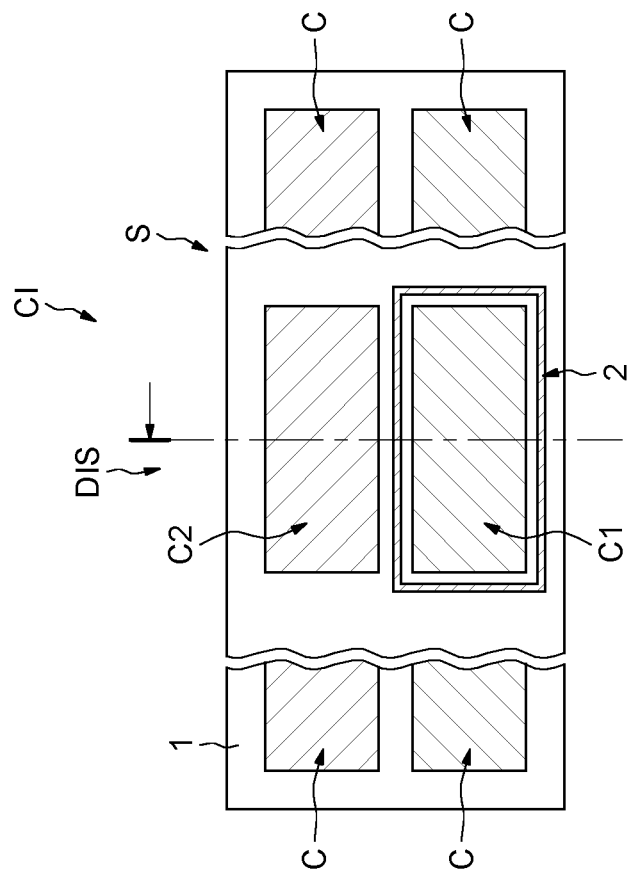
FIG. 1 is a plan view.

In FIG. 1, of which FIG. 2 is a cross-sectional view along the cutting line II-II, the reference CI denotes an integrated circuit having a semiconductor substrate S of a first conductivity type, for example a substrate of p-type conductivity in this case.

The substrate includes, for example, a plurality of semiconductor wells C at least some of which comprise components, for example transistors, that are able to form memory cells and encryption circuits.

In order to protect the data stored in the memory cells, the integrated circuit comprises a plurality of devices for detecting thinning of the substrate via its rear face Fr, of which a single device is shown in FIG. 1 for the sake of simplicity.

The device DIS has a first configuration in which it is configured to perform detection of potential thinning of the substrate S via its rear face Fr, and a second configuration in which it does not perform detection, and is therefore deactivated.

The device DIS includes a first semiconductor well C1 of a second conductivity type, in this case n-type conductivity, and a second semiconductor well C2 of the first conductivity type, in this case p-type, neither of which have components.

The first well C1 and the second well C2 are delineated by an isolating trench 1, for example of shallow trench isolation (STI) type, which delineates the edges of the two wells in a rectangular shape, and which extends from the front face Fv of the substrate as far as a depth smaller than the depth of the first well C1.

The first well C1 is furthermore isolated from the rest of the substrate S by the p-n junction J that it forms with the rest of the substrate, and which in this case delineates the bottom of the first well C1, and by an isolating region comprising the isolating trench 1 and an additional isolation trench 2 formed at the periphery of the first well C1. The additional isolation trench 2 extends through the isolating trench 1, from the front face of the substrate as far as beyond the p-n junction J, so as to provide continuity of the electrical isolation between the isolating trench 1 and the p-n junction J.

The additional isolation trench 2 and the isolating trench 1 thus delineate and isolate the edges of the first well C1, and make it possible to avoid the formation of a p-n junction on the edges of the first well C1.

In this first embodiment, the bottom of the second well C2 opens onto the rest of the substrate S, and is therefore electrically coupled thereto.

The additional isolation trench 2 in this case includes an isolating wall 21, for example made of silicon oxide, and is filled with a semiconductor material 20, for example polysilicon in this case.

The additional isolation trench 2 in this case therefore has the appearance of an isolated vertical electrode, and although it is not used as such, production of this electrode is particularly advantageous from a manufacturing process point of view.

Specifically, with the integrated circuit CI including memory cells, isolated vertical electrodes used as such are formed in the integrated circuit CI, for example in one of the wells C, and make it possible to select memory cells during normal operation of the integrated circuit.

Thus, forming the additional isolation trench 2 using the same manufacturing process as the isolated vertical electrodes makes it possible to dispense with implementing a specific manufacturing step, which would make it possible for example to form additional trenches with different appearances.

It would moreover be possible to form an isolation region comprising just one isolation trench 2 extending into the substrate so as to extend beyond the p-n junction. That being said, forming such an isolation trench would require specific manufacturing steps.

With the second well C2 being of p-type conductivity and opening onto the substrate S, said well is electrically coupled to the portion of the substrate situated immediately underneath the first well C1 inside the additional isolation trench 2.

A first contact zone Zk is formed on the first semiconductor well conventionally by forming a first highly doped zone 50 and a first silicided zone 51. The first contact zone Zk makes it possible to form a contact terminal for the first well C1, for example a first electrode made of tungsten and coupled to the interconnection portion of the integrated circuit CI.

A second contact zone Za is formed on the second semiconductor well C2 conventionally by forming a first highly doped zone 60 and a first silicided zone 61. The second contact zone Za makes it possible to form a contact terminal for the second well C2, for example a second electrode made of tungsten and coupled to the interconnection portion of the integrated circuit CI.

The device DIS thus includes a diode D formed by the junction J of the first semiconductor well C1 and the portion of the substrate S situated underneath the first well C1, coupled to the second well, and of which the cathode comprises the first contact zone Zk and the anode comprises the second contact zone Za.

The device DIS furthermore includes biasing circuit MPL, for example in this case a circuit coupled to a voltage source, coupled between the anode Za and the cathode Zk of the diode D, and that are configured, in the first configuration, to bias the diode D to a value greater than its threshold voltage. In this case, the biasing circuit MPL is configured, in the first configuration, to bias the anode Za to a positive voltage, for example 1.2 volts, and to connect the cathode Zk to ground.

Comparison circuit CMP, for example in this case a comparator, is coupled to the cathode Zk and is configured, in the first configuration, to measure the current flowing through the diode D, and to compare this current with a threshold value.

The comparison circuit CMP is configured to generate a control signal having a first value if the value of the current flowing through the diode is greater than the threshold value, and having a second value if the value of the current flowing through the diode is lower than the threshold value.

In the event of thinning of the substrate via its rear face Fr, conventionally using a focused ion beam (FIB), the thinning of the substrate extends until it reaches the lower portion of the additional isolation trench 2. The connection between the anode Za and the cathode Zk is thus broken, and the current measured by the comparison circuit CMP drops, and therefore falls below the threshold value.

The integrated circuit CI includes a control unit (not shown) configured in particular, upon receipt of the control signal having the second value, to save the secure information stored in the memory cells and to reset or disconnect the integrated circuit CI.

When the integrated circuit CI is booted, the device DIS is in its first configuration, and if no thinning of the substrate is detected (in other words if a lack of thinning of the substrate is detected), the device DIS changes to its second configuration, in which it is deactivated, and no longer acts as a detection means. The integrated circuit is then activated as per its normal operation.

In this respect, the device DIS includes control circuit MCM, for example in this case a logic circuit, that is configured to initially put the device DIS in its first configuration and to change the device DIS from its first configuration to its second configuration after detection of a lack of thinning of the substrate by deactivating the biasing circuit MPL and the comparison circuit CMP.

Therefore, the circuit is thus protected against attacks comprising thinning of the substrate via its rear face Fr.

Figure 4:
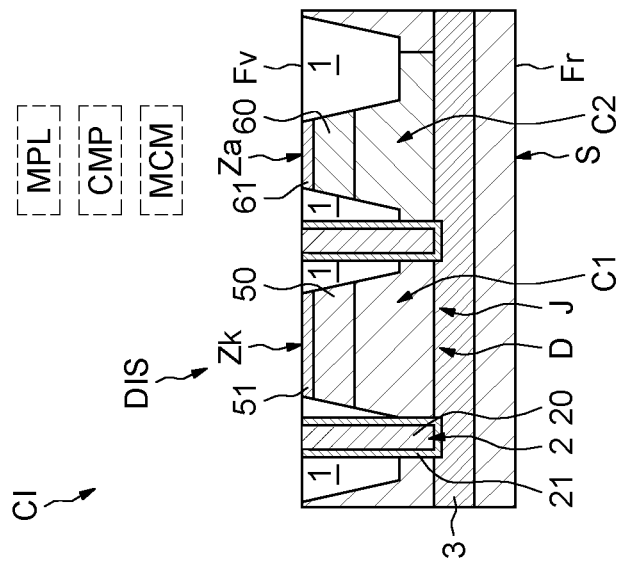
FIG. 4 is a cross-sectional view.
Figure 3:
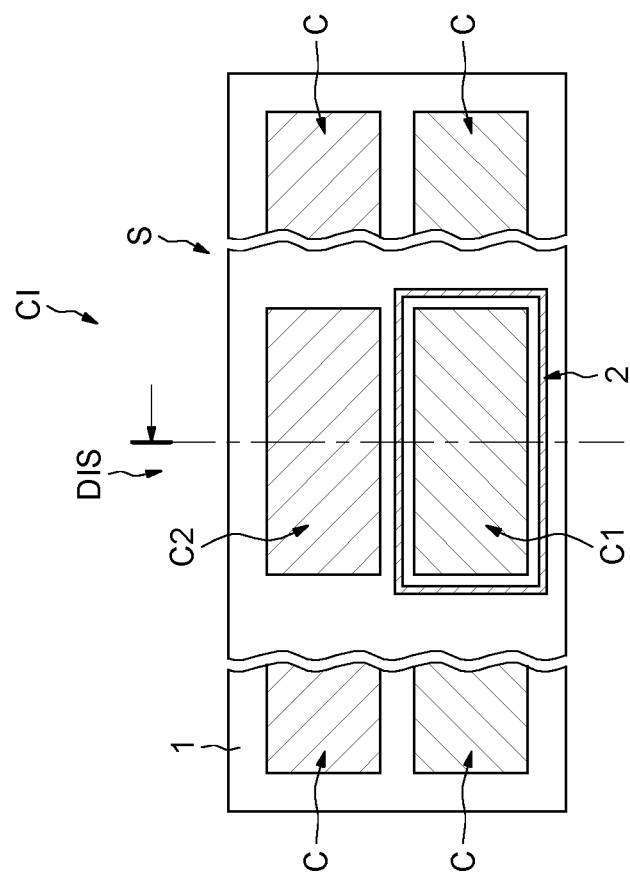
FIG. 3 is a plan view.

FIG. 3, of which FIG. 4 is a cross-sectional view along the cutting line IV-IV, illustrates a variant implementation in which the first well has a p-type conductivity and the second well has an n-type conductivity. The integrated circuit includes a buried semiconductor layer 3, conventionally referred to using the term "NISO" (n-type isolation) by those skilled in the art, of n-type conductivity and delineating the bottom of the first well C1 and the bottom of the second well C2.

The buried semiconductor layer 3 is more highly doped than the second semiconductor well C2.

In this embodiment, the additional isolation trench extends through the isolating trench 1, from the front face of the substrate as far as the buried semiconductor layer 3, so as to provide continuity of the isolation between the isolating trench 1 and the bottom of the first well C1.

The p-n junction J in this case includes the junction between the first well C1 and the buried semiconductor layer 3.

Thus, in this embodiment, it is no longer necessary to form an additional isolation trench that extends beyond the p-n junction J, thereby advantageously making it possible to dispense with some steps of the manufacturing process.

It should be noted that the surface area of the rear face Fr of the substrate, which face is thinned during an attack using a focused ion beam, is of the order of twenty-five square micrometers. Thus, in order to protect the circuit regardless of the location of the thinning on the rear face Fr, the integrated circuit CI described above in conjunction with FIGS. 1 to 4 includes at least one device DIS per twenty-five square micrometer surface area.

Figure 5:
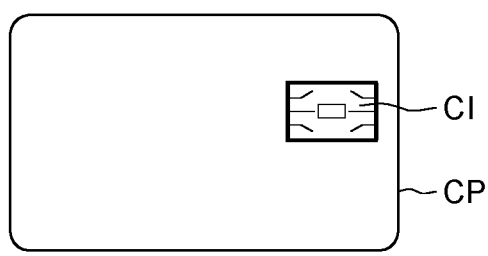
FIG. 5 is a schematic view of a card implementing the protection features of FIGS. 1-4.

The integrated circuit described above in conjunction with FIGS. 1 to 4 may be incorporated into any type of system, in particular into a chip card CP, as illustrated in FIG. 5.

The invention claimed is:

1. A method for detecting thinning of a semiconductor substrate of an integrated circuit from a rear face, the semiconductor substrate comprising a first semiconductor well isolated from the semiconductor substrate by a p-n junction delineating a bottom of the first semiconductor well, the method comprising:
    biasing the p-n junction corresponding to an on state of the p-n junction;
    comparing a current flowing through the p-n junction with a threshold value;
    generating a control signal having a first value corresponding to a detection of a lack of thinning of the semiconductor substrate if the value of said current is greater than the threshold value, and having a second value corresponding to a detection of thinning of the semiconductor substrate if the value of the current is lower than the threshold value; and
    in response to the control signal having the first value indicating detection of a lack of thinning of the semiconductor substrate, deactivating circuitry of the integrated circuit which performs the steps of biasing and comparing.

2. An integrated circuit, comprising:
    a semiconductor substrate having a rear face;
    a detection device configured to detect a thinning of the semiconductor substrate via its rear face, including:
        a first semiconductor well electrically isolated from the semiconductor substrate by a p-n junction delineating the bottom of the first semiconductor well and by an isolation region;
        a biasing circuit configured, in a first configuration, to apply a bias to the p-n junction corresponding to an on state of the p-n junction; and
        a comparison circuit coupled to said p-n junction and configured to compare a current flowing through said p-n junction with a threshold value and to generate a control signal having a first value corresponding to a detection of a lack of thinning of the semiconductor substrate if the value of said current is greater than the threshold value, and having a second value corresponding to a detection of thinning of the semiconductor substrate if the value of the current is lower than the threshold value; and
    a control circuit operating in response to the control signal having the first value indicating detection of a lack of thinning of the semiconductor substrate by deactivating said biasing circuit and said comparison circuit.

3. The integrated circuit according to claim 2, wherein the control circuit is configured to initially put the detection device in a first configuration where the biasing circuit and comparison circuit are activated and then change the detection device from the first configuration to a second configuration where the biasing circuit and comparison circuit are deactivated in response to generation of the control signal having the first value.

4. The integrated circuit according to claim 2, wherein the isolation region includes:
    an isolating trench delineating the edges of the first semiconductor well and extending into the semiconductor substrate from a front face of the substrate as far as a distance from the bottom of the first semiconductor well; and
    an additional isolation trench extending through the isolating trench, from the front face of the semiconductor substrate at least as far as the p-n junction so as to provide continuity of the electrical isolation between the isolating trench and the bottom of the first semiconductor well.

5. The integrated circuit according to claim 4, wherein the semiconductor substrate has a first conductivity type, the first semiconductor well is of the first conductivity type, the second semiconductor well is of the second conductivity type, the circuit further including a buried semiconductor layer of the second conductivity type formed underneath the first semiconductor well and underneath the second semiconductor well, the p-n junction including a p-n junction between the first semiconductor well and the buried semiconductor layer.

6. The integrated circuit according to claim 2, further including a second semiconductor well that is located alongside the first semiconductor well, a first contact zone being formed in the first semiconductor well at the front face, and a second contact zone being formed in the second semiconductor well at the front face, the biasing circuit being configured to apply a bias to the junction by applying a potential difference between the first contact zone and the second contact zone.

7. The integrated circuit according to claim 6, wherein the semiconductor substrate has a first conductivity type, the first semiconductor well is of the first conductivity type, the second semiconductor well is of the second conductivity type, the circuit further including a buried semiconductor layer of the second conductivity type formed underneath the first semiconductor well and underneath the second semiconductor well, the p-n junction including a p-n junction between the first semiconductor well and the buried semiconductor layer.

8. The integrated circuit according to claim 6, wherein the first semiconductor well and the second semiconductor well each have a surface area of around 0.25 square micrometers at the front face, and the second semiconductor well is separated from other wells of the integrated circuit by at least 0.8 micrometers.

9. The integrated circuit according to claim 6, wherein the semiconductor substrate has a first conductivity type, the first semiconductor well is of a second conductivity type, the second semiconductor well is of the first conductivity type and is electrically coupled to the rest of the semiconductor substrate, and the p-n junction includes a p-n junction between the first semiconductor well and the semiconductor substrate.

10. The integrated circuit according to claim 2, wherein the integrated circuit is a component of a chip card.

11. A system including the integrated circuit of claim 2.

12. The system according to claim 11, wherein the system is a chip card.

* * * * *